United States Patent
Komada et al.

(10) Patent No.: US 10,389,089 B2
(45) Date of Patent: Aug. 20, 2019

(54) NITRIDE SEMICONDUCTOR LASER DEVICE

(71) Applicant: SHARP KABUSHIKI KAISHA, Sakai, Osaka (JP)

(72) Inventors: Satoshi Komada, Sakai (JP); Yuhzoh Tsuda, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/147,614

(22) Filed: Sep. 29, 2018

(65) Prior Publication Data

US 2019/0148917 A1    May 16, 2019

(30) Foreign Application Priority Data

Nov. 14, 2017 (JP) ................... 2017-219451

(51) Int. Cl.
  *H01S 5/343* (2006.01)
  *H01S 5/22* (2006.01)

(52) U.S. Cl.
  CPC ............ *H01S 5/34333* (2013.01); *H01S 5/22* (2013.01); *H01S 2304/04* (2013.01)

(58) Field of Classification Search
  CPC ..... H01S 5/34333; H01S 5/22; H01S 2304/04
  See application file for complete search history.

(56) References Cited

U.S. PATENT DOCUMENTS

| 2004/0056242 | A1* | 3/2004 | Ohno | B82Y 20/00 257/13 |
| 2009/0092166 | A1* | 4/2009 | Kamikawa | B82Y 20/00 372/50.1 |
| 2011/0140083 | A1* | 6/2011 | Driscoll | H01L 21/0237 257/15 |
| 2016/0352077 | A1* | 12/2016 | Kasahara | H01S 5/34333 |

FOREIGN PATENT DOCUMENTS

JP    2006-165453 A    6/2006

* cited by examiner

*Primary Examiner* — Yuanda Zhang
(74) *Attorney, Agent, or Firm* — ScienBiziP, P.C.

(57) ABSTRACT

A nitride semiconductor laser device sequentially includes, between a nitride semiconductor substrate and an n-side cladding layer, a first nitride semiconductor layer formed of an AlGaN layer, a second nitride semiconductor layer that is formed of an AlGaN layer and has a lower Al content than the first nitride semiconductor layer, a third nitride semiconductor layer formed of a GaN layer, a fourth nitride semiconductor layer formed of an InGaN layer, and a fifth nitride semiconductor layer formed of an AlGaN layer.

7 Claims, 2 Drawing Sheets

NITRIDE SEMICONDUCTOR LASER DEVICE

BACKGROUND

1. Field

The present disclosure relates to a nitride semiconductor laser device.

2. Description of the Related Art

Semiconductor laser light sources have been used in the fields of, for example, high-density recording on optical discs such as DVDs, image processing, medical equipment, and measuring equipment. Nitride semiconductor laser devices including a GaN substrate can be used for such laser light sources.

In the related art, a nitride semiconductor laser device having a multilayer structure that includes buffer layers 201, an n-side cladding layer 202, an n-side light guide layer 203, an active layer (light-emitting layer) 204, a p-side cap layer 205, a p-side light guide layer 206, a p-side cladding layer 207, and a p-side contact layer 208 grown on a GaN substrate 200 by metal-organic vapor phase epitaxy and that also includes n-side electrodes 209 and a p-side electrode 210 is provided as illustrated in FIG. 2 (e.g., refer to Japanese Unexamined Patent Application Publication No. 2006-165453). The n-side cladding layer 202 and the p-side cladding layer 207 are each an AlGaN single layer or each have an AlGaN/GaN superlattice structure.

In such a structure, light emission occurs in the active layer 204 of the nitride semiconductor laser device through recombination between electrons injected from the n-side layers and holes injected from the p-side layers. The light is confined between the n-side cladding layer 202 and the p-side cladding layer 207 and propagates in a direction perpendicular to the lamination direction of the semiconductor multilayer structure. Resonator end faces are formed on both ends in the propagation direction. Light is subjected to resonant amplification between the pair of resonator end faces while stimulated emission is repeatedly performed, and part of the light is emitted as laser light from the resonator end face.

SUMMARY

In the related art, in a wavelength range with an oscillation wavelength of 460 nm or more, the optical confinement factor decreases in an active layer of a nitride semiconductor laser device. This decrease in the optical confinement factor increases the threshold current density. This is believed to be because in a nitride semiconductor laser device, the difference in refractive index between AlGaN used as a cladding material and GaN used as a light guide material decreases as the wavelength increases.

For GaN substrates, an n-side electrode and a p-side electrode can be placed on upper and lower surfaces of a laser device, and GaN substrates are excellent in terms of heat dissipation properties and cleavage properties. In the above-described known structure, however, when an AlGaN layer having a lower lattice constant than GaN is formed in a structure in which coherent growth is performed at a lattice constant of a GaN layer, tensile strain is generated. As a result, cracks are formed and a flat cleavage plane is not provided. In particular, in a green wavelength range of 490 nm to 530 nm, the active layer has a high In content, which makes it difficult to form an active layer having a high light emission efficiency. This increases the threshold current and the threshold voltage and decreases the life span.

In addition, a further reduction in ripple in a far field pattern (FFP) is desired for semiconductor laser devices including the above-described GaN substrate. Such ripple is believed to be caused by leakage of spontaneously emitted light to the GaN substrate. To achieve the reduction in ripple, it is desired that the amount of light that leaks to the GaN substrate is decreased.

It is desirable to provide a nitride semiconductor laser device which includes a substrate made of a nitride semiconductor and in which light is satisfactorily confined while formation of cracks is suppressed and ripple in a far field pattern can be reduced.

According to an aspect of the disclosure, there is provided a nitride semiconductor laser device including an n-side cladding layer, an active layer, and a p-side cladding layer disposed on a nitride semiconductor substrate, the nitride semiconductor laser device including, between the nitride semiconductor substrate and the n-side cladding layer sequentially from the nitride semiconductor substrate, a first nitride semiconductor layer containing AlGaN, a second nitride semiconductor layer containing AlGaN and having a lower Al content than the first nitride semiconductor layer, a third nitride semiconductor layer containing GaN, a fourth nitride semiconductor layer containing InGaN, and a fifth nitride semiconductor layer containing AlGaN.

DESCRIPTION OF THE EMBODIMENTS

Hereafter, a nitride semiconductor laser device according to an embodiment of the present disclosure will be described with reference to the attached drawings.

Figure 1:
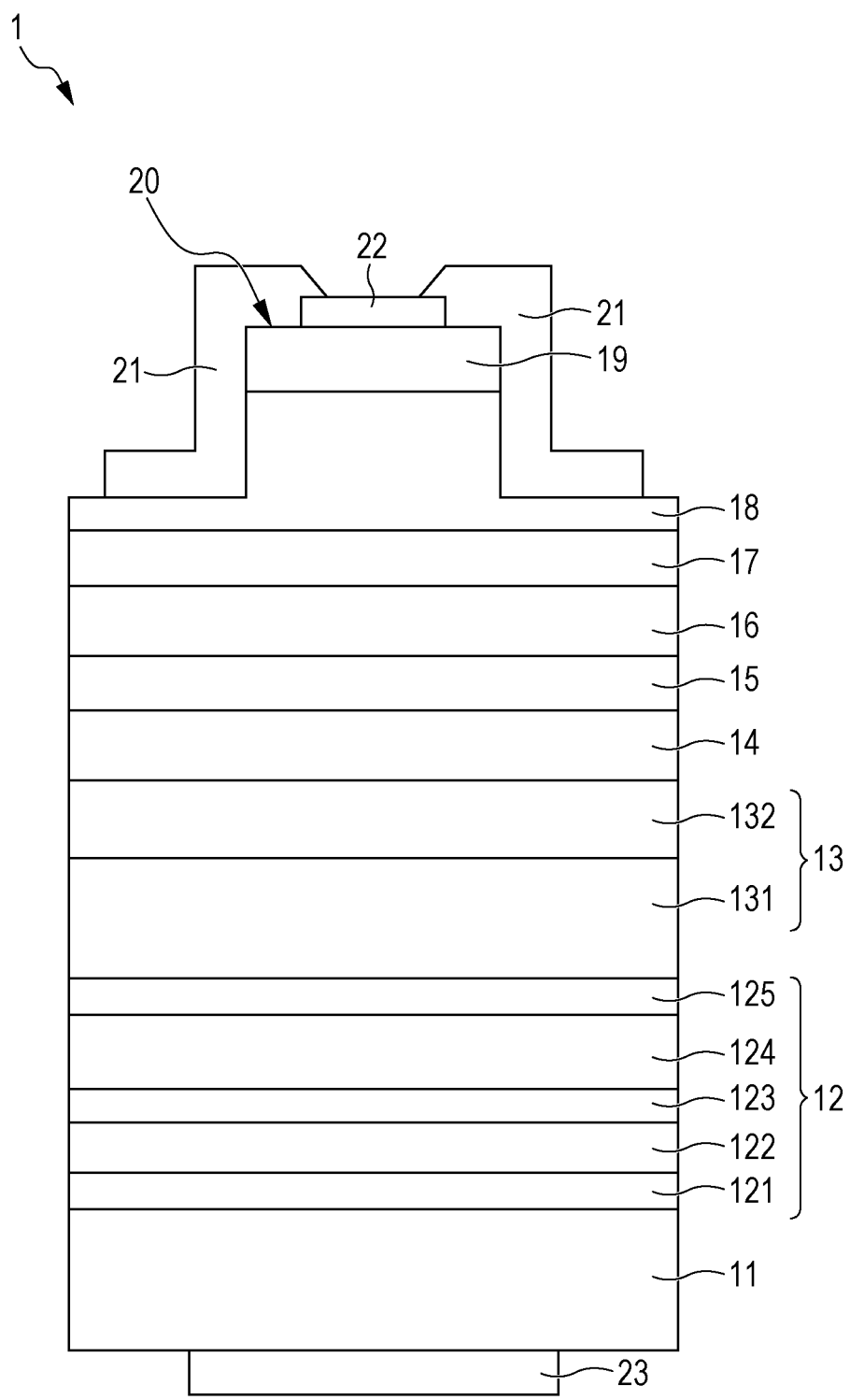
FIG. 1 is a sectional view schematically illustrating a nitride semiconductor laser device according to an embodiment of the present disclosure.
Figure 2:
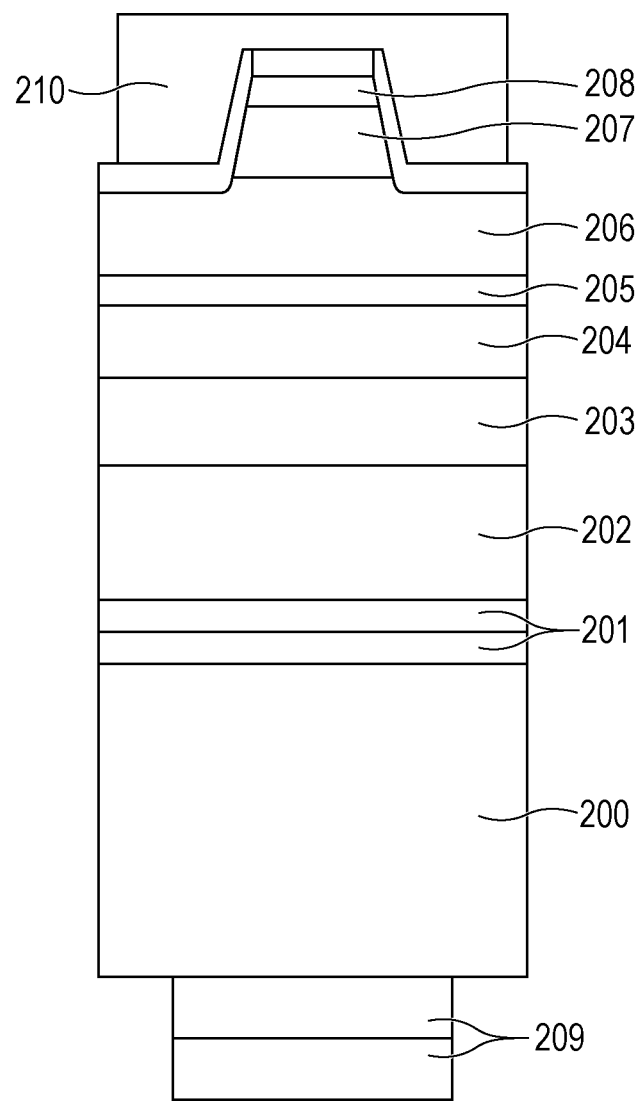
FIG. 2 is a sectional view schematically illustrating a known nitride semiconductor laser device.

FIG. 1 is a sectional view schematically illustrating a nitride semiconductor laser device according to an embodiment. In FIG. 1 and FIG. 2, hatching that indicates sections is omitted to clarify the drawings. In each of the drawings, for example, the length, width, and thickness are appropriately changed to clarify the drawings, and do not correspond to the actual dimensions.

Whole Structure

In a nitride semiconductor laser device 1 according to an embodiment, a plurality of nitride semiconductor layers are formed as base structure layers 12 on a nitride semiconductor substrate 11. An n-side cladding layer 13, an n-side light guide layer 14, an active layer 15, a p-side light guide layer 16, a p-side carrier block layer 17, a p-side cladding layer 18, and a p-side contact layer 19 are sequentially formed on the base structure layers 12. Before the description of the base structure layers 12 in the nitride semiconductor laser device 1, layers other than the base structure layers 12 will be described.

Nitride Semiconductor Substrate

The nitride semiconductor substrate 11 of the nitride semiconductor laser device 1 may be a GaN substrate, and a substrate having conductivity through addition of Si as an n-type impurity is used. Since the nitride semiconductor laser device 1 includes the nitride semiconductor substrate 11 containing Si, electric current can be moved in a lamination direction of each layer, series resistance can be decreased, and the chip structure can be simplified. The base structure layers 12 described later are grown on the nitride semiconductor substrate 11.

N-Side Cladding Layer

A plurality of n-side cladding layers 13 are disposed on the base structure layers 12. A first n-side cladding layer 131 in contact with the base structure layers 12 is an AlGaN layer. This enables sufficient optical confinement in a light-emitting region. The first n-side cladding layer 131 may have an Al content of 5% or more. To suppress cracking, the Al content may be 10% or less and the thickness may be 800 to 1200 nm.

A GaN layer is disposed as a second n-side cladding layer 132 on the first n-side cladding layer 131. The second n-side cladding layer 132 may be formed so as to have a thickness of 100 nm to 400 nm. This can relax residual strain and restore the crystallinity.

The first n-side cladding layer 131 and the second n-side cladding layer 132 may be doped with Si. In this case, the Si concentration may be $1\times10^{18}/cm^3$ to $3\times10^{18}/cm^3$. This ensures the conductivity.

The term "doped" refers to intentional addition of a conductive impurity to a semiconductor crystal, and the doped semiconductor layer refers to a semiconductor layer to which a conductive impurity has been added. The term "undoped" refers to a state of a semiconductor crystal to which a conductive impurity is not intentionally added. This state includes a state in which impurities such as C, H, O, and Cl and conductivity-control impurities having substantially no influence on the conductivity are unavoidably mixed in a semiconductor crystal during crystal growth.

N-Side Light Guide Layer

An n-side light guide layer 14 is formed on the n-side cladding layer 13. The n-side light guide layer 14 is an InGaN layer and may have an In content of 1% to 5%.

The n-side light guide layer 14 is grown using InGaN that constitutes the n-side light guide layer 14, which can increase the optical confinement efficiency. The n-side light guide layer 14 may have a thickness of 150 to 200 nm and may be an undoped layer to suppress the deterioration of crystallinity. The presence of the n-side light guide layer 14 can improve the light emission efficiency of well layers of an active layer 15 described later.

Active Layer

An active layer 15 is formed on the n-side light guide layer 14. The active layer 15 may have a multiple quantum well structure alternately including well layers and barrier layers. For example, the active layer 15 can be a double quantum well structure including three barrier layers and two well layers, starting with a barrier layer and ending with a barrier layer.

The barrier layers may each be a GaN layer and the well layers may each be an InGaN layer. The barrier layer has an effect of restoring the crystallinity. The well layer is preferably formed of a nitride semiconductor material having a band gap energy lower than that of the barrier layer and is particularly preferably formed of InGaN. The atomic composition ratio in the well layer is not particularly limited, and any atomic composition ratio can be selected in accordance with the oscillation wavelength.

In the active layer 15, light is emitted from a plurality of well layers. Therefore, each of the well layers desirably has the same In content and thickness to maintain monochromaticity. The barrier layers may have different thicknesses.

P-Side Light Guide Layer

A p-side light guide layer 16 is formed on the active layer 15. The p-side light guide layer 16 is an InGaN layer having the same In content and thickness as the n-side light guide layer 14. The optical confinement factor is improved as the thicknesses of the p-side light guide layer 16 and the n-side light guide layer 14 are increased. Therefore, by employing undoped layers whose In content is relatively reduced, the deterioration of crystallinity with increasing the thickness is suppressed.

P-Side Carrier Block Layer

A p-side carrier block layer 17 is formed on the p-side light guide layer 16. The p-side carrier block layer 17 is an AlGaN layer and may have an Al content of 15% to 30%. To exhibit p-type characteristics, the p-side carrier block layer 17 largely contains Mg as a p-type impurity, and Mg may be added in a concentration of $1\times10^{18}/cm^3$ to $9\times10^{18}/cm^3$. The p-side carrier block layer 17 may have a thickness of 5 to 15 nm.

Under these conditions, the p-side carrier block layer 17 can effectively block electrons injected into the active layer 15, which can increase the injection efficiency and can decrease the threshold current. Furthermore, the small thickness can suppress an increase in resistance.

P-Side Cladding Layer

A p-side cladding layer 18 is formed on the p-side carrier block layer 17. The p-side cladding layer 18 is an AlGaN layer and may have an Al content of 3% to 5%. To exhibit p-type characteristics, the p-side cladding layer 18 largely contains Mg as a p-type impurity, and Mg may be added in a concentration of $1\times10^{18}/cm^3$ to $9\times10^{18}/cm^3$. The p-side cladding layer 18 may have a thickness of 600 nm to 800 nm.

Under these conditions, the p-side cladding layer 18 has a lower refractive index than the active layer 15 and can confine light. The low Al content can suppress formation of cracks and reduce the resistance.

P-Side Contact Layer

A p-side contact layer 19 is disposed on the p-side cladding layer 18. The p-side contact layer 19 may be a GaN layer. The p-side contact layer 19 largely contains Mg as a p-type impurity, and the Mg concentration may be $2\times10^{19}/cm^3$ to $9\times10^{19}/cm^3$. The p-side contact layer 19 may have a thickness of about 50 to 150 nm. Thus, the p-side contact layer 19 can decrease the contact resistance and the series resistance.

Electrode

The p-side contact layer 19 and the p-side cladding layer 18 are partly etched by photolithography to form a ridge portion 20. The width of the ridge portion is adjusted to 1.5 to 2 μm.

An insulating film 21 made of $SiO_2$ is formed on the side surfaces of the exposed ridge portion 20 and on the surface of the p-side cladding layer 18 exposed by etching. A p-side metal electrode 22 formed of Pd, Mo, and Au in this order from the p-side contact layer 19 is formed on the surface of the p-side contact layer 19. An n-side metal electrode 23 formed of Hf and Al in this order from the nitride semiconductor substrate 11 is formed on the back surface of the nitride semiconductor substrate 11.

First Nitride Semiconductor Layer: Initial Growth Layer

Base structure layers 12 are grown on the nitride semiconductor substrate 11 so as to be sandwiched between the nitride semiconductor substrate 11 and the n-side cladding layer 13. In an exemplary embodiment, the base structure layers 12 are formed by growing a first nitride semiconductor layer 121, a second nitride semiconductor layer 122, a third nitride semiconductor layer 123, a fourth nitride semiconductor layer 124, and a fifth nitride semiconductor layer 125 on the nitride semiconductor substrate 11.

The first nitride semiconductor layer 121 is formed as an initial growth layer of the base structure layers 12 so as to be in contact with the nitride semiconductor substrate 11. The first nitride semiconductor layer 121 is an AlGaN layer and has an Al content of 10% or more and 25% or less. The first nitride semiconductor layer 121 may be doped with Si. In this case, the Si doping concentration is preferably $1\times10^{19}/cm^3$ or more and more preferably $3\times10^{19}/cm^3$ or more. From the viewpoint of maintaining the crystallinity, the upper limit of the Si doping concentration may be $5\times10^{19}/cm^3$ or less. By keeping such a Si doping concentration, the interface resistance can be decreased.

In the heating process of growing the first nitride semiconductor layer 121 as an initial growth layer on the nitride semiconductor substrate 11, etching and nitrogen loss due to crystal defects of the nitride semiconductor substrate 11 may occur. This disturbs the crystallinity of the first nitride semiconductor layer 121 and deteriorates the surface flatness. If such a problem propagates to the active layer 15, the light emission efficiency decreases and the laser characteristics deteriorate.

In contrast, in the nitride semiconductor laser device 1 according to an embodiment, a thin AlGaN layer having a high Al content is formed as the first nitride semiconductor layer 121 during the initial growth. This can suppress the deterioration of the interface flatness between the nitride semiconductor substrate 11 and the first nitride semiconductor layer 121.

Second Nitride Semiconductor Layer: Ripple-Suppressing Layer

A second nitride semiconductor layer 122 is formed on the first nitride semiconductor layer 121. The second nitride semiconductor layer 122 may have a lower refractive index than the active layer 15 and the n-side light guide layer 14 and the p-side light guide layer 16 formed so as to sandwich the active layer 15. By decreasing the refractive index, the leakage of spontaneously emitted light to the active layer 15 can be reduced. Therefore, the second nitride semiconductor layer 122 is an AlGaN layer.

Nitride semiconductors have different lattice constants depending on their composition. For example, InGaN, GaN, and AlGaN have different lattice constants. Therefore, when such nitride semiconductors lie on top of each other, stress is generated at their interfaces. This stress may cause warpage in the nitride semiconductor laser device 1. If the warpage is large, cracking readily occurs, which decreases the yield.

AlGaN has a lower lattice constant than other nitride semiconductors and thus the AlGaN crystal is hard. Therefore, large stress is generated on a layer grown through lattice matching with the AlGaN crystal. This may cause warpage or cracking in the nitride semiconductor substrate 11.

Accordingly, the second nitride semiconductor layer 122 may be formed so as to have a lower Al content and a larger thickness than the first nitride semiconductor layer 121.

Specifically, the second nitride semiconductor layer 122 may have an Al content of 0.5% or more and 3% or less and a thickness of 1 μm or more and 2 μm or less. The second nitride semiconductor layer 122 is doped with Si to achieve high conductivity and suppress the deterioration of crystallinity. The Si concentration may be in the range of $3\times10^{18}/cm^3$ or more and $1\times10^{19}/cm^3$ or less.

Thus, the second nitride semiconductor layer 122 is made of AlGaN having a low refractive index, which can suppress the leakage of light to the nitride semiconductor substrate 11. This can reduce ripple in a far field pattern and can suppress warpage and cracking, which contributes to achieving monochromaticity of laser light. The second nitride semiconductor layer 122 can be positioned as a ripple-suppressing layer.

Third Nitride Semiconductor Layer: Strain Relaxation Layer

A GaN layer is formed as a third nitride semiconductor layer 123 on the second nitride semiconductor layer 122. The third nitride semiconductor layer 123 is formed to relax strain applied to InGaN from AlGaN. Such strain causes cracking and macrosteps. The cracking deteriorates the characteristics, reliability, productivity, and the like of laser.

In this case, there is provided a structure in which the lattice constant is changed in stages by growing an AlGaN layer serving as the second nitride semiconductor layer 122 having a lower Al content than the first nitride semiconductor layer 121 between an AlGaN layer serving as the first nitride semiconductor layer 121 and a GaN layer serving as the third nitride semiconductor layer 123. That is, AlGaN, InGaN, and GaN have different lattice constants, and the third nitride semiconductor layer 123 is formed of GaN having an intermediate lattice constant between AlGaN and InGaN.

A fourth nitride semiconductor layer 124 described later is grown on the third nitride semiconductor layer 123, and the fourth nitride semiconductor layer 124 is formed of InGaN. Also in this case, a GaN layer serving as the third nitride semiconductor layer 123 is grown between the second nitride semiconductor layer (AlGaN) 122 and the fourth nitride semiconductor layer (InGaN) 124, and therefore AlGaN, GaN, and InGaN can be formed so that the lattice constant is changed in stages. GaN is a binary mixed crystal, which readily provides a high-quality crystal, and has an effect of restoring the crystallinity.

As described above, the third nitride semiconductor layer 123 is a GaN layer having an intermediate lattice constant between the second nitride semiconductor layer 122 located below the third nitride semiconductor layer 123 and the fourth nitride semiconductor layer 124 located above the third nitride semiconductor layer 123, and is configured to relax strain. Therefore, the third nitride semiconductor layer 123 can be positioned as a strain relaxation layer.

Fourth Nitride Semiconductor Layer: Cracking-Suppressing Layer

A fourth nitride semiconductor layer 124 is formed on the third nitride semiconductor layer 123. The fourth nitride semiconductor layer 124 is an InGaN layer.

In the nitride semiconductor laser device 1 according to this embodiment, when the nitride semiconductor substrate 11 is used as a nitride semiconductor substrate, the formation of cracks is suppressed by interposing the fourth nitride semiconductor layer 124 formed of an InGaN layer between the nitride semiconductor substrate 11 and the n-side cladding layer 13.

That is, tensile strain applied to GaN in a crystal by the n-side cladding layer 13 (AlGaN layer in an exemplary embodiment) described later is compensated by compressive strain of this InGaN layer. As a result, the formation of cracks can be suppressed even at a higher Al content and a larger thickness. The fourth nitride semiconductor layer 124 can be positioned as a cracking-suppressing layer.

The fourth nitride semiconductor layer 124 may have an In content of 1% or more and 5% or less. When the In content is within the above range, the deterioration of the crystallinity of the fourth nitride semiconductor layer 124 is not easily caused by InGaN. If the In content is more than 5%, the surface flatness deteriorates and crystal defects are formed, which deteriorates the crystallinity. If the surface flatness is deteriorated, the density of current injected into the active layer is made non-uniform, which decreases the light emission efficiency.

The presence of the fourth nitride semiconductor layer 124 can improve the optical confinement effect of the n-side light guide layer 14 and the p-side light guide layer 16, which increases the design flexibility of a laser structure. The InGaN layer serving as the fourth nitride semiconductor layer 124 has a higher refractive index than the GaN layer serving as the third nitride semiconductor layer 123, which increases the amount of light that enters the nitride semiconductor substrate 11. Therefore, the second nitride semiconductor layer 122 also compensates for the leakage of light to the nitride semiconductor substrate 11 by the action of the fourth nitride semiconductor layer 124.

Fifth Nitride Semiconductor Layer: In Evaporation-Suppressing Layer

A fifth nitride semiconductor layer 125 is formed on the fourth nitride semiconductor layer 124. The fifth nitride semiconductor layer 125 is an AlGaN layer and the Al content may be 10% to 25% for surface flatness. Since the Al content is relatively high, the thickness may be set to be as small as 1 nm to 10 nm to maintain the crystallinity and suppress formation of cracks. This suppresses roughening of the surface of the fourth nitride semiconductor layer 124, and good surface flatness is maintained.

Herein, since InGaN constituting the fourth nitride semiconductor layer 124 grows at low temperature, the migration length of constituent elements during crystal growth is small, which triggers a three-dimensional growth mode. Consequently, the surface flatness tends to be deteriorated. If the surface of the fourth nitride semiconductor layer 124 is not flat, the uniformity of the thickness of the active layer 15 deteriorates, which impairs the monochromaticity and decreases the light emission efficiency. The deterioration of the surface flatness of the fourth nitride semiconductor layer 124 also causes non-uniform injection of carriers.

In particular, in a green wavelength range of 490 nm to 530 nm, the active layer 15 desirably has a multiple quantum well structure having an abrupt interface to improve the characteristics, reliability, and productivity of laser because the active layer 15 has a high In content. Therefore, the surface flatness of the fourth nitride semiconductor layer 124 that serves as one of the base structure layers 12 for the active layer 15 is believed to considerably affect the laser characteristics.

In contrast, in the structure according to this embodiment, the fifth nitride semiconductor layer 125 serving as one of the base structure layers 12 is interposed between the fourth nitride semiconductor layer 124 and the n-side cladding layer 13. Thus, the fifth nitride semiconductor layer 125 serves as an In evaporation-suppressing layer, which improves the surface flatness of the fourth nitride semiconductor layer 124. Consequently, for example, the monochromaticity, light emission efficiency, and laser characteristics in the active layer 15 can be improved.

The nitride semiconductor laser device 1 is obtained by growing each of the above layers on the nitride semiconductor substrate 11 by metal organic chemical vapor deposition (MOCVD) to provide a wafer for producing laser devices, dividing the wafer into individual chips, and forming end faces of a laser resonator.

As described above, the nitride semiconductor laser device 1 according to an embodiment includes the base structure layers 12 of the first nitride semiconductor layer 121 to the fifth nitride semiconductor layer 125 between the nitride semiconductor substrate 11 and the n-side cladding layer 13. Therefore, the effects of the base structure layers 12 are organized, light is satisfactorily confined while formation of cracks is suppressed, and ripple in a far field pattern is reduced.

EXAMPLE 1

In Example 1, a nitride semiconductor laser device 1 was produced by metal organic chemical vapor deposition (MOCVD). First, a nitride semiconductor substrate 11 made of GaN was placed at a predetermined position at which precursors could be supplied. The surface of the nitride semiconductor substrate 11 was heated to 900° C. by using a heater.

Next, trimethylaluminum (TMA), trimethylgallium (TMG), ammonia ($NH_3$), and silane ($SiH_4$) were supplied onto the nitride semiconductor substrate 11 as precursors to grow an n-type AlGaN layer having an Al content of 20%, a Si concentration of $4 \times 10^{19}/cm^3$, and a thickness of 3 nm. Thus, a first nitride semiconductor layer 121 was formed as an initial growth layer of base structure layers 12.

Next, TMA, TMG, $NH_3$, and $SiH_4$ were supplied to grow an AlGaN layer having an Al content of 1%, a thickness of 1500 nm, and a Si concentration of $5 \times 10^{19}/cm^3$. Thus, a second nitride semiconductor layer 122 was formed as a ripple-suppressing layer. The temperature of the nitride semiconductor substrate 11 was increased to 1100° C.

Next, the supply of TMA was stopped and TMG, $NH_3$, and $SiH_4$ were supplied to grow an n-type GaN layer. The n-type GaN layer had a Si concentration of $2 \times 10^{18}/cm^3$ and a thickness of 10 nm, and the temperature of the substrate was kept at 1100° C. Thus, a third nitride semiconductor layer 123 was formed as a strain relaxation layer.

Next, TMG, $NH_3$, $SiH_4$, and trimethylindium (TMI) were supplied to grow an n-type InGaN layer. The n-type InGaN layer had an In content of 4%, a Si concentration of $1 \times 10^{19}/cm^3$, and a thickness of 170 nm. Thus, a fourth nitride semiconductor layer 124 was formed as a cracking-suppressing layer. The temperature of the nitride semiconductor substrate 11 was decreased to 840° C.

Next, the supply of TMI was stopped and TMG, $NH_3$, $SiH_4$, and TMA were supplied to grow an n-type AlGaN layer. The n-type AlGaN layer had an Al content of 20%, a Si concentration of $4 \times 10^{18}/cm^3$, and a thickness of 5 nm and the temperature of the substrate was kept at 840° C. Thus, a fifth nitride semiconductor layer 125 was formed as an In evaporation-suppressing layer.

Then, an n-side cladding layer 13, an n-side light guide layer 14, an active layer 15, a p-side light guide layer 16, a p-side carrier block layer 17, a p-side cladding layer 18, a p-side contact layer 19, an insulating film 21, a p-side metal electrode 22, and an n-side metal electrode 23 were formed within the ranges described in the above embodiment to produce a nitride semiconductor laser device 1.

The produced nitride semiconductor laser device 1 had characteristics of an oscillation wavelength of 504 nm, a slope efficiency of 0.7 W/A, a threshold current of 77 mA, room-temperature continuous oscillation, and an oscillation yield of 100%. The nitride semiconductor laser device 1 according to Example 1 had good characteristics in terms of slope efficiency, threshold current, and oscillation yield.

The nitride semiconductor laser device according to the present disclosure is suitably applicable to light-emitting devices such as LEDs and LDs and light-receiving devices such as CCDs.

The present disclosure contains subject matter related to that disclosed in Japanese Priority Patent Application JP 2017-219451 filed in the Japan Patent Office on Nov. 14, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nitride semiconductor laser device including an n-side cladding layer, an active layer, and a p-side cladding layer disposed on a nitride semiconductor substrate, the nitride semiconductor laser device comprising, between the nitride semiconductor substrate and the n-side cladding layer sequentially from the nitride semiconductor substrate:
   a first nitride semiconductor layer containing AlGaN;
   a second nitride semiconductor layer containing AlGaN and having a lower Al content than the first nitride semiconductor layer;
   a third nitride semiconductor layer containing GaN;
   a fourth nitride semiconductor layer containing InGaN; and
   a fifth nitride semiconductor layer containing AlGaN.

2. The nitride semiconductor laser device according to claim 1,
   wherein the nitride semiconductor substrate contains GaN, and
   the first nitride semiconductor layer has an Al content of 10% or more and 25% or less.

3. The nitride semiconductor laser device according to claim 1,
   wherein the first nitride semiconductor layer contains Si as an n-type impurity and has a Si concentration of $1 \times 10^{19}/cm^3$ or more and $5 \times 10^{19}/cm^3$ or less.

4. The nitride semiconductor laser device according to claim 1,
   wherein the second nitride semiconductor layer contains Si as an n-type impurity and has a Si concentration of $3 \times 10^{18}/cm^3$ or more and $1 \times 10^{19}/cm^3$ or less.

5. The nitride semiconductor laser device according to claim 1,
   wherein the second nitride semiconductor layer has an Al content of 0.5% or more and 3% or less and a thickness of 1 µm or more and 2 µm or less.

6. The nitride semiconductor laser device according to claim 1,
   wherein the fourth nitride semiconductor layer has an In content of 1% or more and 5% or less.

7. The nitride semiconductor laser device according to claim 1,
   wherein the fifth nitride semiconductor layer has an Al content of 10% or more and 25% or less.

* * * * *